(12) United States Patent
Evans et al.

(10) Patent No.: US 7,364,993 B2
(45) Date of Patent: Apr. 29, 2008

(54) METHOD OF ENHANCING THE PHOTOCONDUCTIVE PROPERTIES OF A SEMICONDUCTOR

(75) Inventors: Michael J. Evans, Cambridge (GB); William R. Tribe, Cambridge (GB)

(73) Assignee: TeraView Limited, Cambridge (GB)

( * ) Notice: Subject to any disclaimer, the term of this patent is extended or adjusted under 35 U.S.C. 154(b) by 35 days.

(21) Appl. No.: 10/527,313

(22) PCT Filed: Sep. 11, 2003

(86) PCT No.: PCT/GB03/03933

§ 371 (c)(1), (2), (4) Date: Nov. 18, 2005

(87) PCT Pub. No.: WO2004/025740

PCT Pub. Date: Mar. 25, 2004

(65) Prior Publication Data

US 2006/0134892 A1    Jun. 22, 2006

(30) Foreign Application Priority Data

Sep. 11, 2002    (GB)    ................... 0221056.5

(51) Int. Cl.
*H01L 21/265*    (2006.01)
(52) U.S. Cl. .................. 438/518; 257/E21.528
(58) Field of Classification Search ........... 438/518, 438/519; 257/E21.34, E21.528
See application file for complete search history.

(56) References Cited

U.S. PATENT DOCUMENTS 3,793,717 A * 2/1974 Degenkolb et al. ........ 29/610.1
4,595,427 A * 6/1986 Drew et al. ................. 148/509
4,662,949 A * 5/1987 Inoue et al. ................. 117/43
4,863,877 A    9/1989 Fan et al.
6,541,803 B1 * 4/2003 Folkes ......................... 257/187

FOREIGN PATENT DOCUMENTS

EP    0 606 776 A2 *    7/1994
WO    WO 01/86699 A2    11/2001

OTHER PUBLICATIONS

Coutaz et al., "Be-doped low-temperature grown GaAs for ultrafast optoelectronic devices and applications," *Semiconducting and Insulating Materials Conference 2000*, pp. 89 to 96 (2000).
Lin & Pan, "Near-Bandgap Ultrafast Optical Responses of Furnance Annealed Arsenic-ion Implanted GaAs," *Lasers and Electro-optics Soc. Annual Meeting, Conf. Proceedings IEEE*, vol. 2, pp. 531-532 (Nov. 10-13, 1997).
Tan et al., "Ion-Implanted GaAs for subpicosecond applications," *IEEE Journal of Selected Topics in Quantum Electronics*, vol. 2, No. 3, pp. 636-642 (Sep. 1996).

* cited by examiner

*Primary Examiner*—W. David Coleman
(74) *Attorney, Agent, or Firm*—Dickstein Shapiro LLP

(57) ABSTRACT

A semiconductor material with photoconductive properties and a method of the semiconductor, wherein a base material is grown and then annealed post-growth at a temperature of 475° C. or less. It has been found that be annealing at temperatures of 475° C., or less the carrier lifetime of the material and the resistivity can be optimized so as to obtain semiconductor with useful photoconductive properties.

20 Claims, 6 Drawing Sheets

Figure 1:
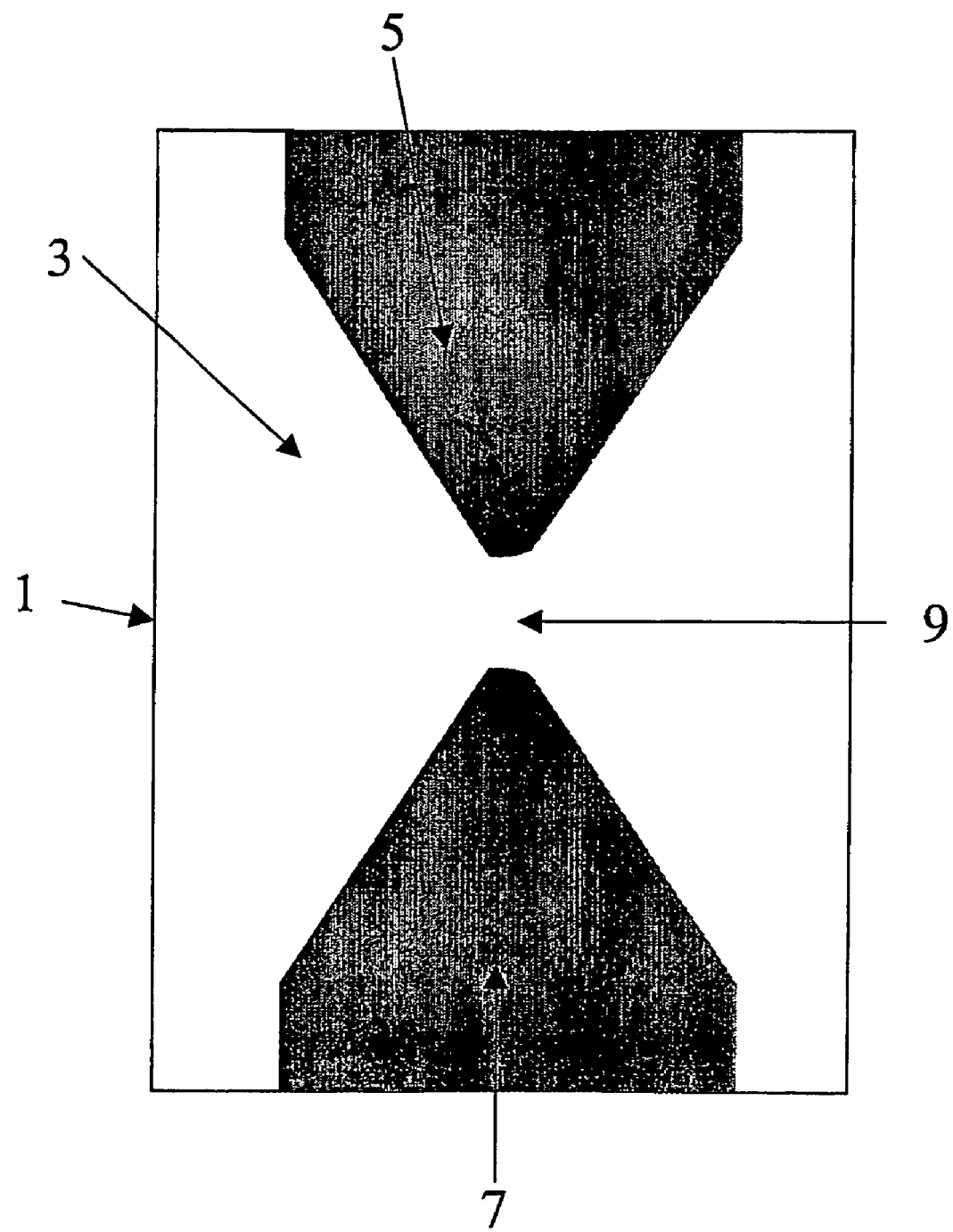

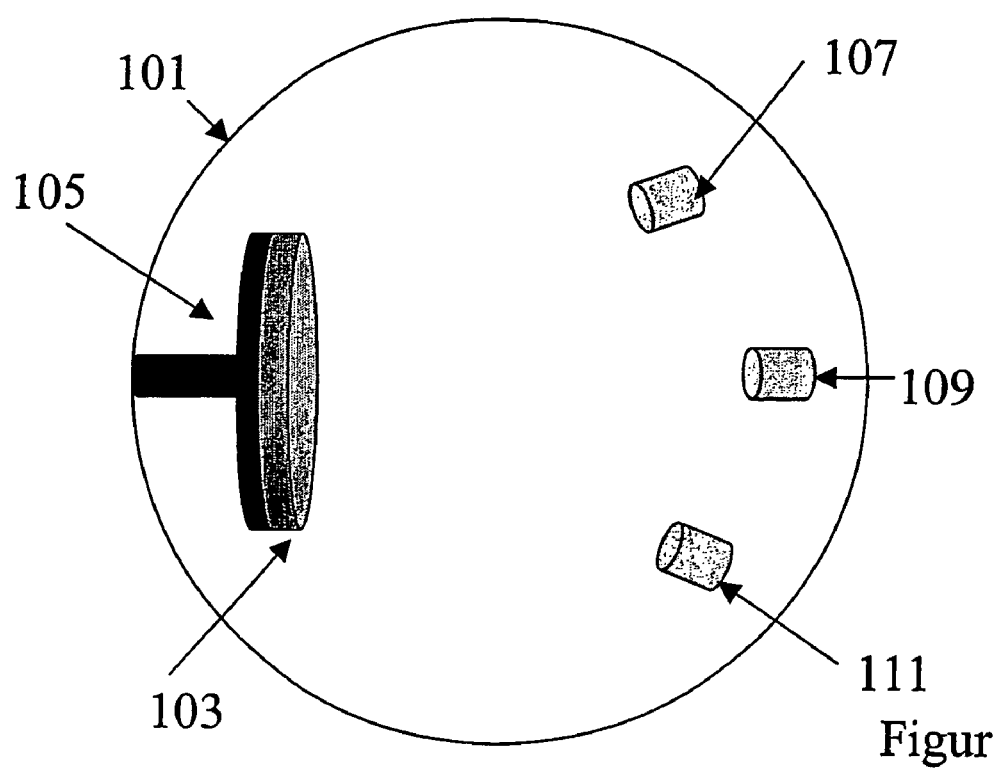
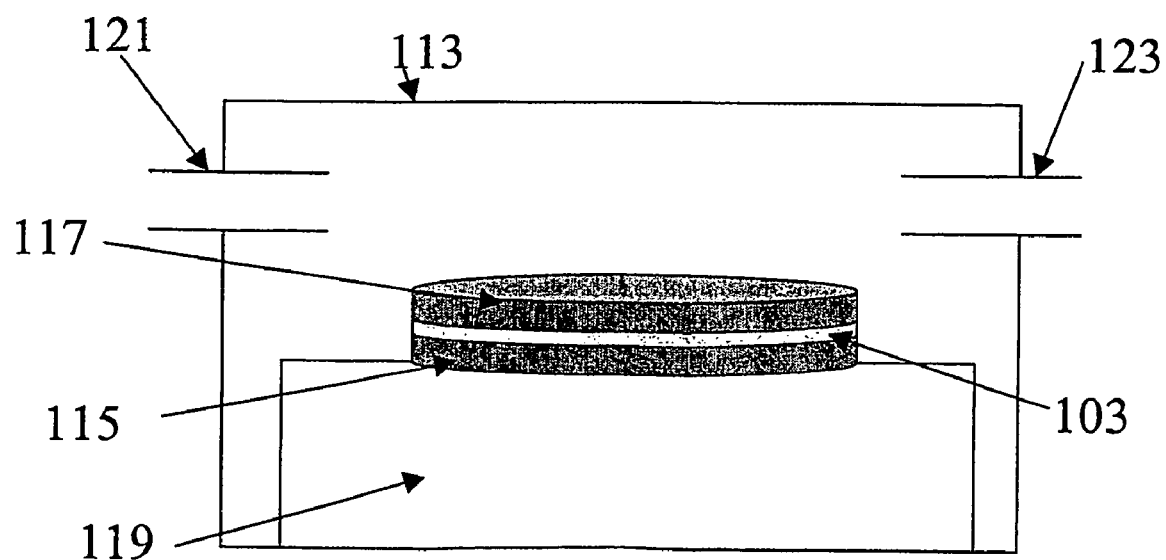

METHOD OF ENHANCING THE PHOTOCONDUCTIVE PROPERTIES OF A SEMICONDUCTOR

The present invention relates to the field of semiconductors, particularly Group III-V semiconductors, with photoconductive properties. These semiconductors have a variety of uses, including photodetection, which is important for optical communications. The present invention is of particular use in the field of generation and detection of radiation in the frequency range colloquially referred to as the Tera-Hertz frequency range, the range being that from 25 GHz to 100 THz, particularly that in the range of 50 GHz to 84 THz, more particularly that in the range from 90 GHz to 50 THz and especially that in the range from 100 GHz to 20 THz.

High purity crystalline semiconductors may be grown by a variety of techniques. These include, but are not limited to, Molecular Beam Epitaxy (MBE), Metal Organic Vapour Phase Epitaxy (MOVPE), Chemical Beam Epitaxy (CBE) and Ultra High Vacuum Chemical Vapour Deposition (UHV-CVD). MBE is considered to offer the highest purity of grown material, and to provide the best control of parameters such as layer thickness, doping density and crystalline quality. MBE can be used throughout the III-V and other semiconductor systems, but the technology is most advanced and developed for the specific example of GaAs. The present invention is illustrated with regard to GaAs based crystals grown by MBE, but may be applicable to other material systems and growth techniques.

Photoconductive semiconductors can be fabricated using low temperature growth MBE, which produces single crystal material crystalographically aligned to the substrate material. It also introduces defects in the crystal structure and lattice strains which allow very short lifetimes to be realised, being typically less than 1 ps. In general, the lower the growth temperature, the greater the defect density, however there is a lower limit to the growth temperature at which excessive crystal defects and strain lead to polycrystalline growth and accordingly increasing lifetimes. For low temperature growth, typically a temperature of between 200° C. and 300° C. is used.

For materials such as GaAs, growth at these low temperatures by MBE is believed to incorporate excess arsenic into the crystal. Typically, up to 2% excess arsenic can be incorporated. This low temperature grown material is referred to as LT-GaAs.

Excess arsenic may also be introduced using As ion implantation on a standard GaAs crystal to introduce the excess As into the crystal lattice. The material produced by this method are referred to as As—GaAs.

Once treated to incorporate or introduce excess arsenic, LT-GaAs or As—GaAs, have extremely short carrier lifetimes, which has been measured at below 100 fs. This is due to the incorporation of the excess As atoms as point defects, which have a high cross section for electron capture (electrons being the majority charge carrier in these materials). From the perspective of photoconductive devices, such low lifetimes equate with very rapid device response times. However, the point defects also give rise to very low device resistivities.

Where such materials are to be used in photoconductive emitters and receivers it is also desirable for the material to have a high resistivity. A low resistivity is not desirable for two reasons. Firstly, in photoconductive devices, the dark current (i.e. the residual current in the absence of illumination) is increased by ease of movement of the majority carriers, and clearly large dark currents will limit the sensitivity of any detector. Secondly, for THz emitters, it is necessary to be able to apply a very large bias across a device without drawing damaging current flows.

One approach for achieving a higher resistivity is to anneal As enriched GaAs after growth. The effect of the anneal is to alter the incorporation of the excess arsenic as point defects, causing its conglomeration into arsenic precipitates distributed throughout the GaAs crystal. For LT-GaAs, annealing may be conducted within the MBE chamber immediately after growth, or it can be performed "ex-situ" in a suitable anneal chamber. Typically, the annealing process is for a duration of 10-15 minutes at temperatures in the region of 500-600° C., as it is considered that such temperatures (and energies) are required to move the elemental species within the crystal lattice. Such an annealing process has been found to fundamentally change the mechanisms for carrier capture, which dramatically increases the resistivity to the point at which it becomes usable for photoconductive devices, but with the penalty that the lifetimes are also increased.

There is therefore a need for a semiconductor material that better satisfies the dual requirements of low lifetime characteristics and high resistivity.

There is also a need for a process of creating a photoconductive semiconductor material with improved resistivity and lifetime characteristics.

There is additionally the need for a radiation emitter comprising a photoconductive semiconductor material with improved resistivity and lifetime characteristics.

There is also the need for a radiation receiver comprising a photoconductive semiconductor material with improved resistivity and lifetime characteristics.

It is an object of the present invention to address at least one problem of the prior art.

According to a first aspect, the present invention provides a method of enhancing characteristic properties of a semiconductor, the method comprising annealing a base material at a temperature of 475° C. or less to form the semiconductor. Preferably the characteristic properties enhanced include carrier lifetime and resistivity.

According to a second aspect, the present invention provides a method of producing a semiconductor material with photoconductive properties, the method comprising annealing a base material at a temperature of 475° C. or less so as to enhance the carrier lifetime of the material and the resistivity of the base material for use as a photoconductor.

A significant advantage of the present invention is that the annealing step is manipulated to optimise or at least enhance the materials. Therefore, it is possible to characterise base material immediately after growth and to subsequently define an anneal regime which is tailored to suit a particular application.

Furthermore, the base material may be cleaved prior to annealing, so that multiple different anneal regimes may be applied to different parts of the base material, and different individual parts of the base material may be optimized for multiple different end uses.

This may have particular cost and efficiency advantages for wafer manufacturers, since wafers of base material may be characterised following the first growth stage, allowing subsequent application specific annealing ex-situ, or with sufficiently reliable growth for an application specific anneal to be performed in-situ requiring no intermediate characterisation.

The above aspects of the invention have specific application to growing the base material by LT growth or As implantation. They are additionally applicable to photoconductive crystalline semiconductors that are annealed post-growth. Most preferably the base material is grown using molecular beam epitaxy and the annealing occurs at a temperature in the range of 250° C. and 450° C.

Although the previous discussion has generally been concerned with GaAs, the present invention may be applied to any semiconductor. Preferably, the method is performed on semiconductors which comprise As, Group III-V or Group II-IV semiconductors with photoconductive properties and most preferably on GaAs, InGaAs or AlGaAs.

For ternary compounds, low temperature annealing may be performed, regardless the mole fraction 'x' of the compound. For example, in the case of $In_xGa_{1-x}As$ the mole fraction may be any value from 0 to 1, thus ranging from InAs to GaAs. Further, the annealing may be performed regardless of the substrate material on which the InGaAs may be grown.

Where the semiconductor is GaAs, it is preferably grown in a molecular beam epitaxy reactor at a temperature in the range of approximately 200° C. to 300° C. In a preferred arrangement, the molecular beam epitaxy is conducted within a growth chamber and the annealing occurs outside the growth chamber.

Preferably the annealing is performed for fifteen minutes or less and occurs in a temperature range of between 250° C. and 400° C. Where the semiconductor material is InGaAs, preferably the annealing occurs in a temperature range of approximately 350° C. and 450° C.

The annealing is preferably performed on the material before any contact or gate metalisation is applied to the material. The annealing is also preferably performed for at least 30 s.

According to a third aspect, the present invention provides a method of determining optimal annealing conditions for a semiconductor material comprising: obtaining a first set of values indicative of resistivity of the material for a plurality of annealing temperatures; obtaining a second set of values indicative of carrier lifetime of the material for a plurality of annealing temperatures; and comparing the first and second sets of values to determine an annealing temperature or a range of annealing temperatures where the carrier lifetime and the resistivity of the material are optimized.

In fourth, fifth and sixth aspects, the present invention provides a semiconductor material, a photoconductive emitter comprising a semiconductor material or a photoconductive receiver comprising a semiconductor material, where the material is formed according to any of the first, second and/or third aspects of the present invention.

Preferably the photoconductive emitter and receiver are a terahertz emitter and receiver respectively. More preferably, the photoconductive emitter and receiver are of the photoconducting antenna type comprising a photoconductive substrate and a pair of spaced apart electrodes provided on a surface of said substrate, the substrate comprising material formed in accordance with the first and/or second aspects of the invention.

For both photoconductive emitters and detectors it is desirable to have the shortest possible carrier lifetime and the largest resistance. In the case of some materials, e.g. GaAs, both the resistance and the carrier lifetime increase with increasing annealing temperature. Therefore, by just comparing resistivity and lifetime data it may be difficult to choose an optimum annealing temperature without further guidance. To produce a good photoconductive emitter, it is desirable to maximize the resistance. Therefore, preferably when producing photoconductive material for an emitter, the annealing conditions which give the maximum resistivity while maintaining a relatively low carrier lifetime should be used. For example, for GaAs, a carrier lifetime of less than 300 fs is desirable.

Conversely, for photoconductive detectors, it is desirable to use the shortest lifetime possible while maintaining a relatively high resistance. The value of the resistance, which may be used, depends on the antenna design and the detection electronics. A man skilled in the art would be able to determine the minimum acceptable resistance.

For other materials, such as InGaAs, the carrier lifetime is believed to decrease and increase with increasing annealing temperature, whereas the resistance is believed to increase and then decrease with increasing temperature. The minimum in the carrier lifetime and the maximum in the resistance are believed to roughly coincide with one another and hence the optimum material for both a detector and an emitter may be produced using the same annealing conditions.

The inventors have found that preferably, InGaAs should be annealed at a temperature within the range from 350° C. to 450° C. Within this annealing range there is a minimum in the carrier lifetime and a maximum in the resistance or resistivity. For InGaAs this allows carrier lifetimes of less than 1 ps to be realised.

Therefore, in a seventh aspect, the present invention provides a photoconductive antenna comprising a photoconducting substrate and two electrodes provided on the surface of said photoconducting substrate, said photoconducting substrate comprising InGaAs having a carrier lifetime of less than 1 ps.

InGaAs having such a short carrier lifetime is of use in a wide variety of fields. Thus, in an eighth aspect, the present invention provides a photoconductive element comprising InGaAs, said InGaAs having a carrier lifetime of at most 1 ps.

When performing an experimental optimization procedure as described above it is preferable to only experiment with the annealing conditions where an effect on the carrier lifetime or resistance is likely to be observed. In order to determine these annealing conditions, measurements on the excess arsenic concentration may be performed as variations in the resistance or carrier lifetime are only likely to be observed when the annealing conditions are sufficient to cause a decrease in the excess arsenic concentration. The excess arsenic concentration may be measured by X-ray diffraction as excess arsenic may cause the crystal lattice to be strained.

Measurements of the excess arsenic concentration also allow the preferred anneal time i.e. the anneal time above which no further changes are happening to the structure of the base material.

Preferably the third aspect of the present invention further comprises determining an preferred annealing duration for the material. For example, where the material contains As, the preferred annealing duration can be determined by obtaining a third set of values indicative of arsenic concentration of the material for a plurality of annealing durations and for at least one annealing temperature; and comparing the at least one third set of values with the first and second sets of values to determine an annealing duration and an annealing temperature which together optimize the carrier lifetime and the resistivity of the material.

In the case of standard THz pulsed imaging systems, it is common for GaAs to be used as the photoconductive material for the emitters and receivers, and this material is photoexcited using a Ti:Sapphire laser. However, there are cost advantages that may result from the use of a pulsed laser with wavelengths in the 1 µm region, but as these wavelengths are below the band gap of GaAs, the same emitters and receivers cannot directly be used.

$In_xGa_{1-x}As$ has a lower bandgap than GaAs, that can be tuned by varying the composition x. Thus, by suitable choice of the composition, materials may be produced that are accessible not only to so called 1 micron lasers, but also to applications that may require any longer wavelengths, which may include the 1.3 and 1.55 µm regions often exploited for optical communications and fibre-optics.

However, for THz applications, InGaAs, and LT-InGaAs, have not provided material with sufficiently short lifetimes and/or sufficiently high resistance. The present invention enables the use of LT-InGaAs emitters and receivers with 1 micron lasers, to provide THz systems that have a cost advantage over those based on GaAs and Ti:Sapphire lasers.

According to a ninth aspect, the present invention provides an investigative system comprising a laser configured to emit a pump beam having a wavelength in the range from 1.3 and 1.55 µm, an emitter configured to emit emitted radiation in response to irradiation by said pump beam and a detector for detecting said emitted radiation, wherein either or both of the emitter or detector comprise InGaAs. Preferably the pump beam has a wavelength in the range from 1040 nm to 1070 nm.

In the ninth aspect of the invention, InGaAs is used as either the emitter or detector of an investigative system. Such a system may be used for imaging or determining composition information from structures.

If both an InGaAs emitter and detector are provided, these may be used directly with a laser having a wavelength in the range from 1040 nm to 1070 nm. Relatively cheap lasers are available which operate in this wavelength regime.

If only one of the emitter or detector comprise InGaAs, a frequency conversion means may be applied in the path of radiation emitted from the laser. An advantage of this aspect of the invention is that a cheap laser can be utilized in an emission/detection system while still making use of existing mature THz emitter or detector technology created for shorter wavelengths.

The aspects of the present invention have been primarily described with reference to their use in THz radiation emission and detection. However, the above aspects of the present invention have utility in a variety of fields, including high speed switching and opto-electronics, microwave electronics, quantum computing and integrated circuit design.

Figure 4:
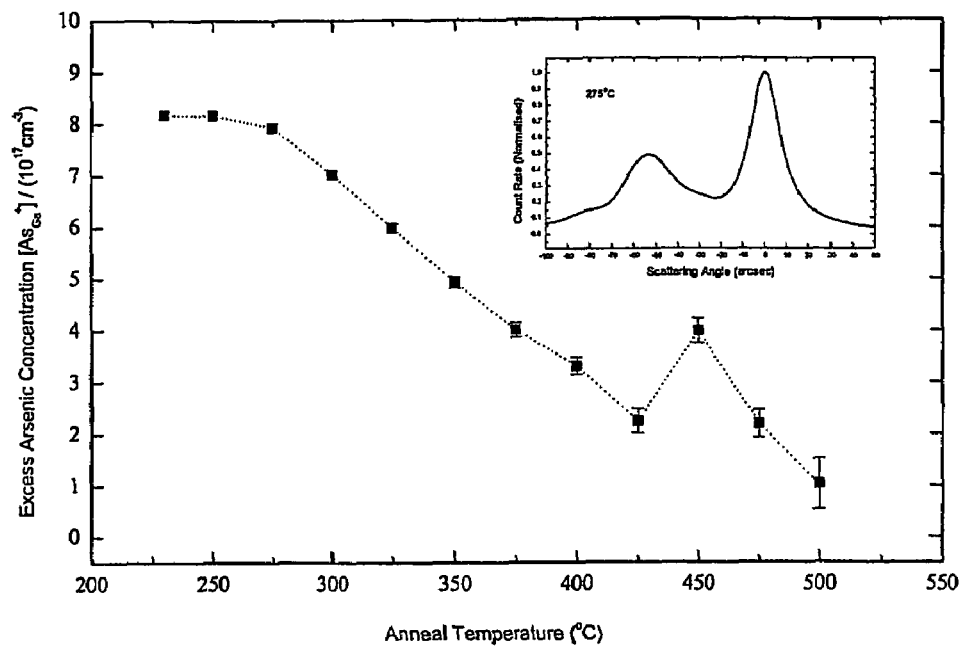
Figure 5:
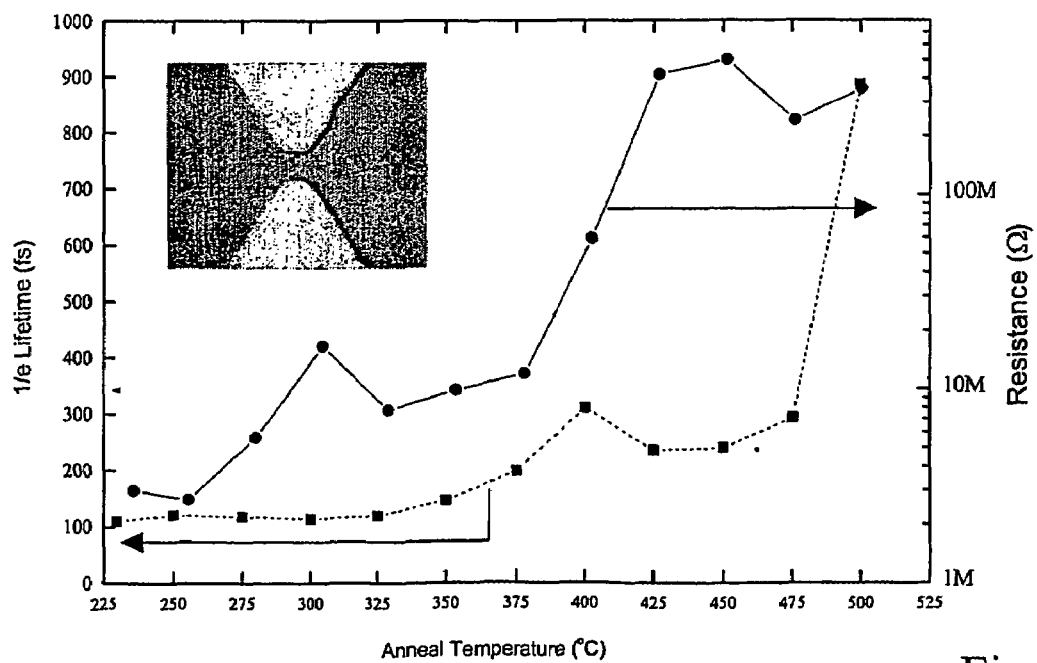
Figure 6:
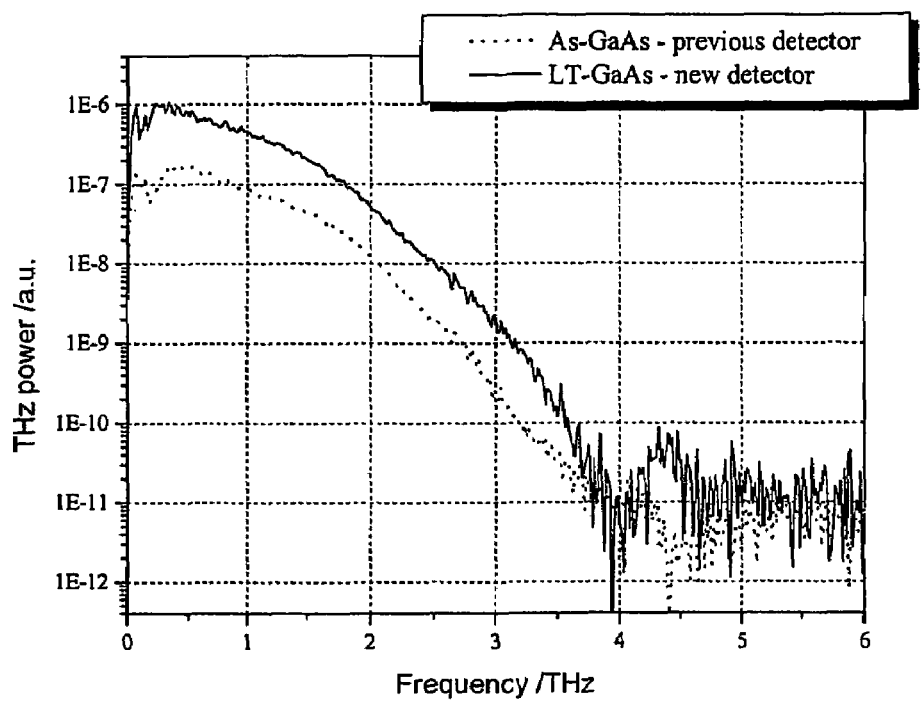
Figure 7:
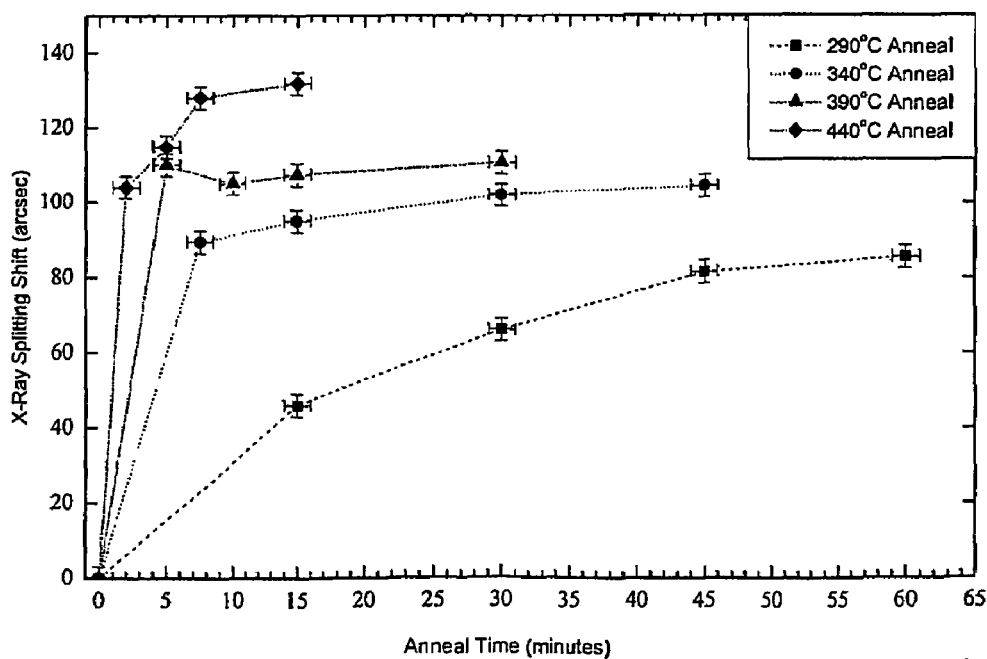
Figure 8:
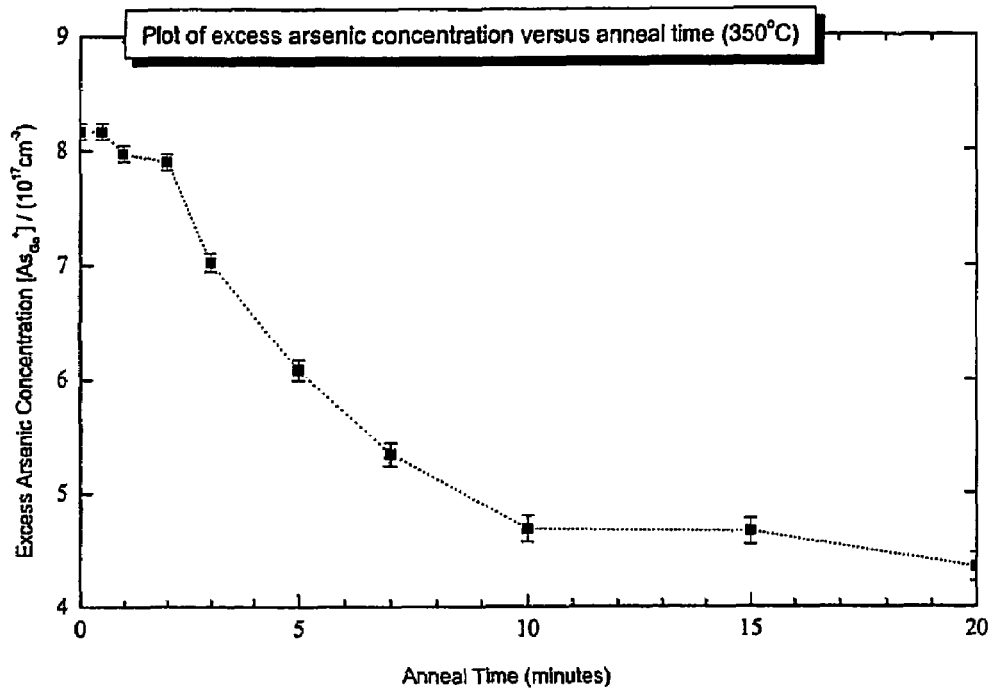

The present invention will now be described with reference to following non-limiting embodiments, in which:

FIG. 1 illustrates a schematic photoconductive antenna, which may be used with photoconductive material provided in accordance with an embodiment of the present invention;

FIG. 2 schematically illustrates a wafer in an MBE chamber;

FIG. 3 schematically illustrates contact annealing apparatus;

FIG. 4 graphically illustrates measurements of excess arsenic concentration versus annealing temperature for LT-GaAs;

FIG. 5 graphically illustrates the relationship between the lifetime and annealing temperature as well as resistance against annealing temperature for LT-GaAs;

FIG. 6 provides a comparison of a LT-GaAs receiver created using an annealing temperature of 325° C. for a period of 10 minutes with another receiver created using known techniques. The graph compares the THz power received by each receiver as a function of frequency;

FIG. 7 provides a graph of peak splitting shift obtained through x-ray diffraction measurements against anneal time for LT-GaAs;

FIG. 8 illustrates a plot of excess arsenic concentration versus anneal time for LT-GaAs.

Figure 9:
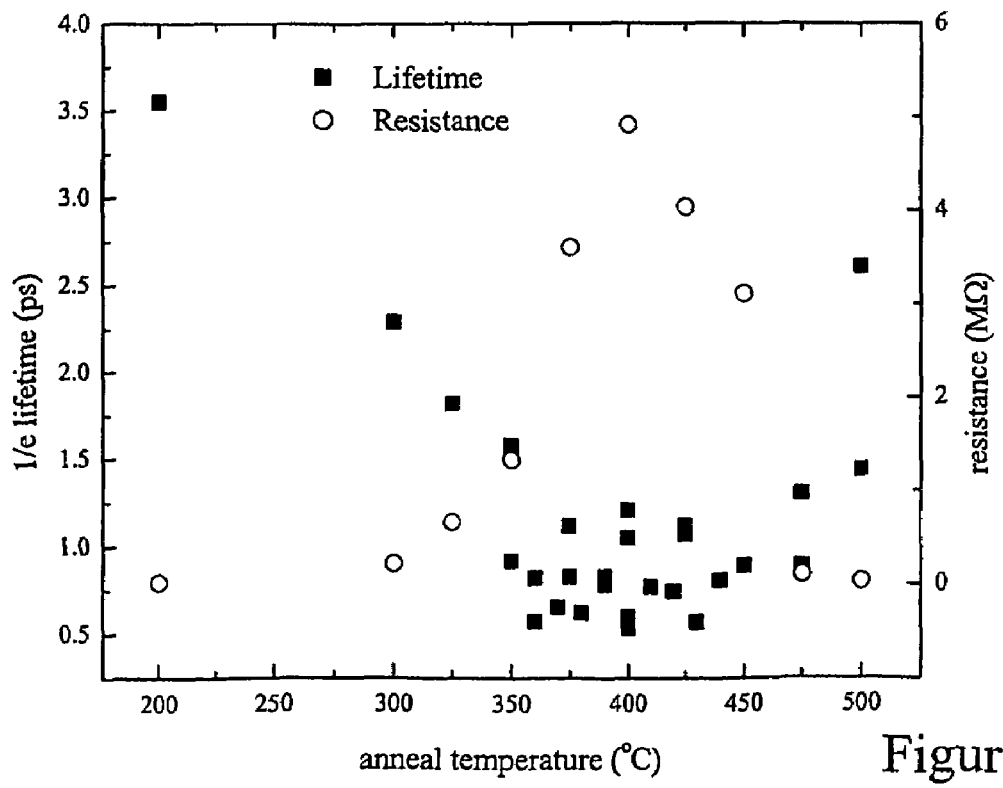
Figure 10:
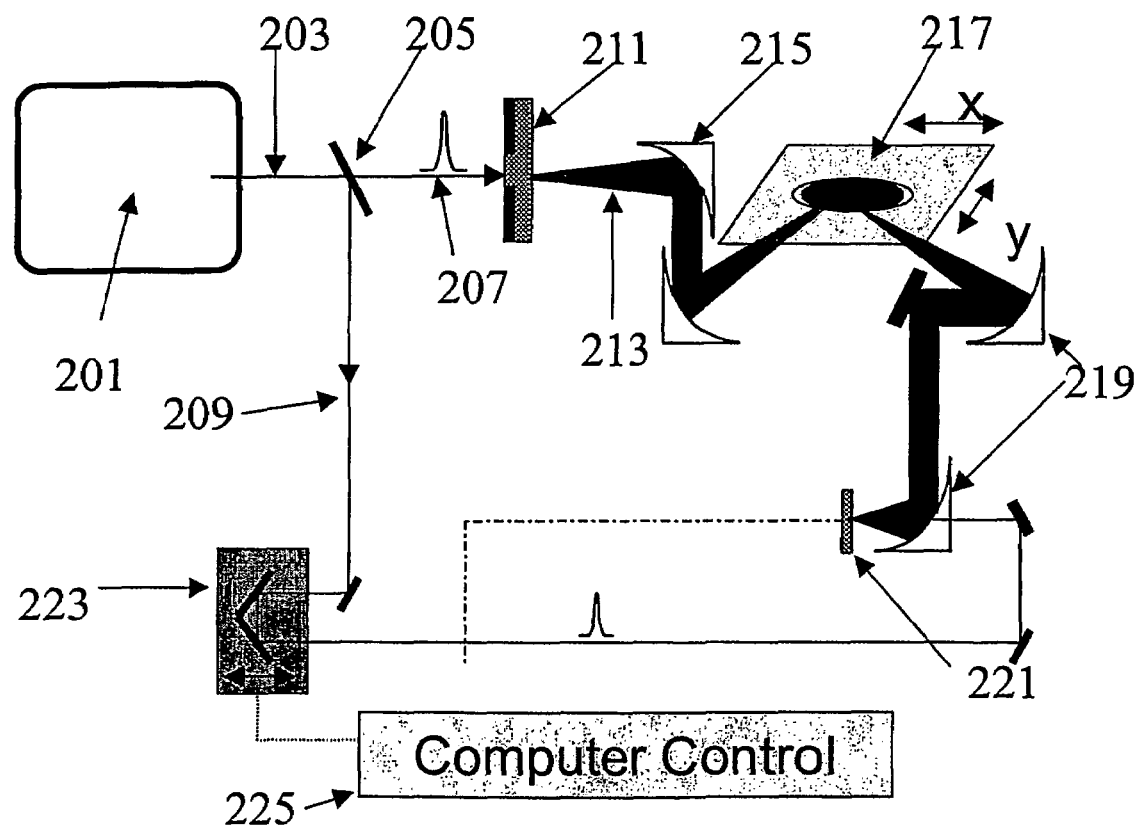

FIG. 9 graphically illustrates the relationship between lifetime and anneal temperature as well as resistance and anneal temperature for LT-InGaAs; and FIG. 10 is a schematic of an imaging system comprising an emitter and a detector in accordance with an embodiment of the present invention.

FIG. 1 schematically illustrates a photoconductive antenna 1 in accordance with an embodiment of the present invention. The photoconductive antenna comprises a photoconductive material produced in accordance with an embodiment of the present invention.

The antenna 1 may be configured as either an emitter or a detector.

The photoconductive antenna comprises a photoconducting substrate 3. Two electrodes 5, 7 are provided on a surface of said substrate 3. The electrodes 5, 7 are generally triangular in shape and are arranged in mirrored relation with their apexes facing. The apexes being spaced apart by photoconducting gap 9. The facing apexes are blunted or rounded.

Both generation and detection of radiation, particular Terahertz radiation, can be effected using short lifetime pulses, which are inherently broadband and rely on ultra-fast lasers, or using continuous wave (CW) radiation which relies on continuous wave laser sources and is monochromatic.

In the former case for emission of radiation, a sub-picosecond optical/NIR laser pulse of appropriate wavelength is directed onto the photoconductive antenna of FIG. 1.

Upon exposure of the substrate 3 to a pulse of suitable wavelength, the conductivity of the substrate increases by a large factor, such that current flows through the material between the electrodes 5 and 7, due to the presence of the bias electric field applied between the electrodes. The photo-generated current transient radiates in broadband with frequencies up to the Terahertz range. The current will persist for a time corresponding to the "lifetime" of the photo-created charge carriers in the material, provided the bias field is maintained.

For the latter case of CW radiation, a photoconductive antenna of the type shown in FIG. 1 is again employed, illuminated by two CW lasers of slightly differing frequency. When a bias is applied between the two electrodes 5 and 7, the non-linear I-V characteristic of the device leads to photo-mixing of the two CW lasers, and re-radiation at their difference frequency (i.e. monochromatically). This frequency can be extended up to the THz range where THz generation is required.

While the generation mechanisms of these techniques differ, they both rely on laser excitation and suitably fabricated photoconductive devices. By definition, these devices exhibit an increase in their electrical conductivity when exposed to light of a suitable wavelength.

For detection, the photoconductive antenna 1 is operated in a similar fashion to the above. The photoconductive antenna 1 is again irradiated using either a sub-picosecond optical/NIR laser pulse of appropriate wavelength or by two CW lasers of slightly differing frequency. In addition, the radiation which is to be detected is directed onto the reverse side of the antenna 1. If the detected radiation is present, a current flows between the electrodes which may be measured in order to indicate the presence and strength of detected radiation.

The choice of photoconductive material for such emitters and detectors generally depends upon the laser excitation source. GaAs is particularly useful, as its band-gap matches well to Ti:Sapphire laser wavelengths and also to laser diode wavelengths. Ti:Sapphire lasers are commonly used in both pulsed and CW systems and laser diodes are commonly used in CW systems. Therefore the photoconductive material is chosen so that the material has a band-gap that is suitable for the wavelength of the laser.

Annealing the material at high temperatures after growth relieves the crystal strain and shrinks the lattice, precipitating out excess arsenic into hexagonal clusters, which increases resistivity. However, the high temperature annealing process also has the opposite effect on the carrier lifetime, which increases. The present invention, however, has recognised that by controlling the temperature, and to a lesser extent the time, at which the post growth anneal is performed will allow the material to be optimized for its specific application.

Conventional wisdom is, where As related Group III-V semiconductors are concerned, excess arsenic concentrations incorporated as point defects need to be reconfigured within the crystal, as the point defects reduce the resistivity of the material. To date, this has been achieved by annealing at high temperatures, as it is at high temperatures that maximum liberation of the arsenic occurs, and which are established by high quality MBE growth techniques as being required for movement of arsenic atoms to minimise the crystalline structural energy.

FIG. 2 schematically illustrates a typical growth chamber 101 used to produce photoconducting materials. A substrate 103, upon which the photoconducting material is to be grown is placed on wafer holder 105. The wafer holder 105 is positioned such to face cells 107, 109 and 111 which contain the constituent materials of the photoconducting material. For example, if the photoconductive material is InGaAs, the cells 107, 109 and 111 will comprise In, Ga and As in elemental form.

During growth, the wafer holder 103 revolves in order to ensure that the material is evenly grown. Once the material is grown, it is then removed from the growth chamber 101 and transferred to the annealing apparatus shown in FIG. 3.

For the results which will be discussed in relation to FIG. 4, a sample was grown using the apparatus of FIG. 2. This sample, which will be termed "wafer A" consisted of 1 micron of LT GaAs (grown at nominally 230° C.), grown on 500 nm of AlAs (grown at around 600° C.) by Molecular Beam Epitaxy (MBE), and all grown on a buffered GaAs substrate (wafer A). The quoted LT growth temperature has been described as "nominal", as at low temperatures, the pyrometers used for temperature calibration of MBE growth cease to operate accurately, and so LT growth temperatures are determined by extrapolating graphs of heater power vs. pyrometer readings at higher temperatures.

The apparatus of FIG. 3 is an example of apparatus which may be used for contact annealing. The apparatus comprises an annealing chamber 113. In the annealing chamber 113, the sample 103 is sandwiched between two wafers of semi-insulating GaAs 115 and 117. The purpose of the sandwiching arrangement is to passivate the surface of the sample with like semiconductor material, to prevent the liberation of the excess arsenic from the crystal. Although the sides of the sample are not passivated in this way—and thus excess arsenic could escape through this route—the surface area of the sides is much smaller than that of the other two surfaces.

The apparatus also comprises heating element 119, which is provided in thermal contact with at least one of the GaAs wafers 115 and 117. The apparatus is configured to perform rapid thermal annealing by ramping the heating element 119 up to the target temperature as rapidly as possible, the target temperature being measured by an accurately calibrated thermocouple mounted very close to the sample itself. The ramping is completed within around 10 seconds. After the appropriate duration of anneal, which in this case was 10 minutes, the temperature falls below 200° C. within around 30 seconds. It is to be appreciated that this annealing procedure occurs before any metalisation such as gates or ohmic contacts are applied.

Additionally, to further inhibit liberation, the annealing is performed in an atmosphere of nitrogen gas, although other gas mixtures, such as forming gas (a hydrogen and nitrogen mix) could equally be employed. To achieve this, the annealing chamber 13 is provided with gas inlet 21 and outlet 23.

Other annealing schedules could in principle be adopted, all of which attempt, in some way to passivate the surfaces of the sample. These techniques may include performing the anneal in some gaseous atmosphere without additional approaches (common gases including, but not being limited to, inert gases such as nitrogen or argon, forming gas, which is a mixture of hydrogen and nitrogen, or oxygen). In the specific case of semiconductors containing arsenic, annealing may be performed in an arsenic overpressure environment. Alternatively, the sample surface may be coated prior to annealing, with an example of a suitable cap being silicon nitride.

FIG. 4 is a graph of excess arsenic concentration against anneal temperature for the above described GaAs sample.

To obtain the graph of FIG. 4, an X-ray diffraction technique was used. This technique is sensitive to the strain in the crystal that is caused by the incorporation of excess As atoms on the crystalline sites which would otherwise be occupied by Ga atoms (referred to as $As_{Ga}^+$ sites, as the defect is associated with a positive charge).

Individual X-ray diffraction curves show two distinct peaks, as can be seen in the inset graph shown to the top right of FIG. 4, which was measured at an anneal temperature of 275° C. The dominant peak at an angle of 0 arcsecs corresponds to the underlying GaAs substrate upon which the photoconducting layer was formed, while the weaker peak at around −53 arcsecs is that of the LT GaAs layer, and is shifted from the dominant peak by the strain. The peak splitting can be related to the concentration of $As_{Ga}^+$ sites, and the values derived in this way are shown plotted against the anneal temperature in the main graph of FIG. 4. As the excess As is removed from the Ga sites to produce the precipitates, the $As_{Ga}^+$ concentration decreases.

Thus the graph shows that the concentration of arsenic atoms occupying gallium sites is lowest at the higher temperatures and that saturation occurs when all the arsenic is liberated, which is at above 500° C. The error bars on the final five data points of FIG. 4 (at 400, 425, 450, 475 and 500° C.) become progressively larger because at these temperatures the two peaks of the X-ray diffraction are not clearly resolved, and so curve fitting routines must be employed to extract their positions.

However, another feature of this graph, which is key to the present invention, is that the excess arsenic concentration starts dropping from about 250° C., which indicates that even at this low temperature, arsenic is moving about within the crystal. Therefore, this illustrates that for GaAs annealing temperatures from about as low as 250° C. could be utilised to precipitate out excess arsenic.

FIG. 5 is a graph plotting the relationship between the annealing temperature on the x-axis and lifetime as well as resistance on the y axis.

The top curve is the resistance measurement for different annealing temperatures, and the bottom curve is the lifetime measurements for different annealing temperatures. The latter is determined by a method called time resolved photoreflectance, that has a minimum resolution of around 100 fs. Hence data points in the region of 100 fs place a maximum value on the lifetime; the actual lifetime may be less than this value but this would not be discernible from the experimental error. This data was obtained from the material described with reference to FIGS. 2 and 3 above (wafer A), with an annealing duration of ten minutes. It is to be appreciated the resistance scale utilised is on a log scale.

Furthermore, the graph shows resistance rather than resistivity because calculations of the latter are complicated by the exact details of the antenna design. Since we are only interested in maximising this value, and in achieving a suitable resistance for a particular sample, it is sufficient to assess samples only in terms of the measured resistance, as is done here. In order to standardise these measurements, all resistances quoted in this description refer to a blunted bow-tie antenna (of the type shown in FIG. 1) with a 5 µm gap (a micrograph of the central region of this type of antenna is shown in the inset to FIG. 5). This graph therefore shows that in the temperature range of 225° C. to 375° C., the resistance has increased to around 10 MΩ. In this temperature range it is also apparent that there is only a slight increase in lifetime from about 100 fs to 200 fs. These resistances are usable, particularly in the case of their use in receivers, and the lifetimes are excellent for use in receivers.

Between 375° C. and 475° C. a sharp increase in resistance occurs, by an order of magnitude, which is a desirable result. The lifetime in this temperature range also increases to between approximately 200 and 300 fs. However, while the lifetime values have increased, they are still quite usable, particularly for emitters, where although short lifetimes are required, the shortness is not as critical as it is for receivers. Further, for emitters, it is an advantage to have very high resistances to maximise the electric field that can be applied to an antenna while limiting the current flow. Therefore annealing temperatures in the range of approximately 400 to 475° C. for LT-GaAs to be used in emitters is most preferable.

Above 500° C. the lifetime deteriorates substantially, making those temperatures undesirable for LT-GaAs for uses where a low lifetime is required.

It is to be noted at 400° C. the data point shows a spurious increase in lifetime. It is considered that this is probably the result of a statistical fluctuation and that overall the graph establishes the general trends as discussed. Overall, from this graph it can be concluded that optimum annealing temperatures for LT-GaAs to be used in emitters is around 425° C. and around 325° C. for receivers.

FIG. 6 is a plot of the THz power received against frequency for two receivers formed from photoconducting antennas of the type described with reference to FIG. 1.

The upper trace corresponds to a receiver fabricated from wafer A. The photoconducting material was fabricated using the annealing temperature of 325° C. for a period of 10 minutes.

The lower trace shows results from another receiver created using known techniques. The graph compares the THz power received by each receiver as a function of frequency.

This graph shows that the LT-GaAs receiver formed according to an embodiment of the present invention outperforms the other receiver, particularly in terms of sensitivity, and also with a slight improvement in bandwidth. Directly comparing the LT-GaAs formed in accordance with an embodiment of the present invention with the As—GaAs receiver, which is one currently commonly used, it is worth noting that the improvement in sensitivity is close to an order of magnitude.

In addition to optimising the annealing temperature, it is also possible to optimise the annealing duration. FIG. 7 provides a graph of peak splitting shift obtained through x-ray diffraction measurements against anneal time. To obtain this data, a wafer of LT GaAs grown at nominally 200° C., on a straight GaAs substrate (wafer B) was examined. An increase in the change in x-ray splitting corresponds to a reduction in the excess arsenic concentration.

FIG. 7 therefore demonstrates that saturation of the annealing effect is achieved after 15 minutes for the 340° C., 390° C. and 440° C. temperatures, although slightly longer for the 290° C. anneal, being the lower curve, although a sizeable proportion of the shift does occur in the first fifteen minutes for that temperature.

From this graph it can be concluded that for annealing temperatures of 340° C. and above, an annealing time of between ten and fifteen minutes is sufficient to provide the larger part of the change in the excess arsenic.

This conclusion is further supported by referring to FIG. 8, which illustrates a plot of excess arsenic concentration versus anneal time for wafer A. The data was obtained LT-GaAs wafer grown on AlAs using MBE at a temperature of 350° C. This graph shows that the arsenic concentration decreases dramatically in the first ten minutes of annealing, and only marginally thereafter.

The principles behind optimising the annealing process may be applied to any type of As implanted materials, particularly Group III-V semiconductors utilising arsenic, such as InGaAs, LT-AlGaAs, As—GaAs and doped GaAs.

Considering LT-InGaAs, this is not a material conventionally utilised in radiation emission and detection systems, principally because it is considered difficult to increase its resistivity while maintaining a low lifetime. This is because, the high annealing temperatures utilised in creating InGaAs typically cause breakdown of the crystal quality.

InGaAs is typically created by first growing the material in an MBE chamber at 450° C. The choice of this conventional temperature is related to the fact at much higher temperatures the In species desorbs from the surface during growth, and hence is not incorporated into the crystal. Annealing of LT-InGaAs conventionally occurs at 600° C., which unfortunately provides enough energy to the InGaAs crystal to move around the elemental species themselves, rather than just the excess As.

However, LT-InGaAs may be instead annealed at temperatures at or below 500° C. An advantage of this is that it becomes possible to preferentially adjust the excess As, while leaving the InGaAs crystal untouched.

FIG. 9 illustrates the properties of LT-InGaAs formed in accordance with an embodiment of the present invention. The graph shows the relationship between lifetime and anneal temperature as well as resistance and anneal temperature.

In this case the wafer consisted of 1 micron of LT-$In_{0.3}Ga_{0.7}As$ grown at nominally 230° C., grown on 500 nm AlAs grown at around 600° C., on a buffered GaAs substrate (wafer C). The exact alloy composition is also nominal because it is not well known how preferentially the In species will incorporate in low temperature MBE growth.

FIG. 9 shows a scatter graph of the variation in lifetime and resistance as a function of the anneal temperature. It can be seen that for some temperatures there is a variation in the measured lifetime, as measurements are performed on several nominally identical samples, and on different regions of the same sample. This is considered to be a facet of the difficulty of growing InGaAs on GaAs. It is to be appreciated that InGaAs is highly strained when grown on GaAs substrates due to a mismatch of the lattice constants. This strain can relax with the formation of defects and dislocations in the crystal structure, and hence in principle forming regions having microscopically different properties.

The inventors believe that the scatter is a result of these small variations. Nevertheless, the trend in material properties is established well by the scatter graph. It can be seen that the lifetime improves initially with anneal temperatures between 200° C. and 400° C. At 200° C. the lifetime is of the order of 2.2 ps and at 400° C. it drops to around 0.6 ps. This decrease in lifetime is completely contrary to conventional wisdom and it is considered to occur because the annealing schedule at low temperatures initially reduces any crystalline defects that may be present within the InGaAs layer, again due to its difficult growth. There is a clear minimum in the lifetimes in the region of 400° C. anneal temperature, with the lowest recorded lifetime being 532 fs. Above 450° C. the lifetime is seen to rise.

The resistance at temperatures of 200° C. to 400° C. increases from about zero to 5 MΩ, which is a usable resistance. Above 450° C. the resistance drops.

The inventors conclude that the annealing temperature influences LT-InGaAs in the following manner. At temperatures from 200 to 400° C., the process of precipitation of excess As commences in similar fashion to that for GaAs, but this effect is outweighed by an improvement in crystalline quality that dramatically reduces the lifetime.

In the temperature range of 350-450° C. a clear increase in the resistivity due to the formation of As precipitates, and a minimum in the lifetime, of the order of 500 to 600 fs is seen.

Above 450° C., the situation reverses with the resistance falling sharply as the lifetime rises. When the material was annealed at even higher temperatures, the surfaces took on a different appearance, associated, as established by examination under an electron microscope, with a change in the surface morphology. Noting that these temperatures match and then exceed the temperature for which InGaAs is grown in an MBE reactor, the inventors conclude that at these higher annealing temperatures the InGaAs composition is itself affected on a microscopic scale.

Therefore, for InGaAs, the optimum annealing temperature range is approximately 350° C. and 450° C. These temperatures produce LT InGaAs with a usable resistivity and a greatly improved lifetime. Such a material is capable of being used as a photoconductive material in radiation emitters and receivers.

Variations and additions are possible within the general inventive concept as will be apparent to those skilled in the art. It will be appreciated that while exact annealing conditions will vary depending upon the semiconductor material, the broad inventive concept of the present invention may be applied to any semiconductor material with similar characteristics, regardless of its chemical constituents, so that the exact embodiment shown is intended to be merely illustrative and not limitative.

FIG. 10 schematically illustrates an investigative system in accordance with a further embodiment of the present invention.

In the investigative system of FIG. 10, InGaAs is used as the photoconductive material for both the emitter and the detector. The investigative system may be used for imaging or determining composition information from structures.

In the investigative system laser 201 produces a 1 μm pulsed beam of radiation 203 which is then divided by beam splitter 205 to form a probe beam 207 and a reference beam 209. As an example, the laser may be an Nd:YAG or ND:YLF laser.

The probe beam 207 irradiates emitter 211 to produce a beam of THz radiation 213. The emitter 211 is a photoconducting antenna of the general type described with reference to FIG. 1. The photoconducting material is InGaAs which has been annealed at low temperatures in accordance with the findings described with reference to FIG. 9.

The beam of THz radiation 213 is then directed via a series of mirrors 215 onto sample 217, which is provided on a stage allowing the sample to be scanned in two orthogonal directions. THz radiation, which is reflected from the sample, is then directed via a series of mirrors 219 onto detected 221.

The detector 221 is also a photoconductive antenna, the photoconductive material being InGaAs. In order for the detector to detect THz radiation reflected from the sample, the detector is irradiated with pulses of 1 μm radiation taken from the reference beam 209. In order to vary the phase of the reference beam 209 which reaches the detector 221, the reference beam is directed into a scanning delay line 223 which serves to continually increase and decreases the path of the reference beam and hence varies the phase of the reference beam as it reaches the detector 221. The scanning delay line 221 operates under computer control 225.

In the above described non-limiting embodiment, both the emitter and the detector are fabricated from LT-$In_xGa_{1-x}As$. Thus, both the emitter and the detector have the advantage that they can be excited using a commonly available 1 μm laser. In this case the composition x, matched to the exact laser wavelengths in the 1040 to 1070 region, ranges from 0.2 to 0.3.

Beam splitter 205 is used to split the laser pulses so that both emitter and detector are photoexcited from separate optical systems. Thus, a further variation on the above embodiment of a THz pulsed imaging (TPI) system, may include the use of frequency doubling optics, provided either before beam splitter 205 or within the path of the reference beam 207 or probe beam 209. These optics double the frequency (and energy) of the laser pulses, so enabling them to photoexcite higher bandgap semiconductors, such as GaAs. Thus, in addition to a THz system incorporating a 1 μm laser and LT-InGaAs emitters and receivers, a hybrid system may be envisaged with other combinations of InGaAs emitters and/or receivers, with frequency doubled laser pulses impinging on emitters and/or receivers formed from a different photoconductive material.

The invention claimed is:

1. A method of enhancing the properties of a semiconductor, the method comprising annealing a base material which is produced using As ion implantation at a temperature T to form the semiconductor, the temperature T being 475° C. or less and determined by:

obtaining a first set of values indicative of resistivity of the material for a plurality of annealing temperatures;

obtaining a second set of values indicative of carrier lifetime of the material for a plurality of annealing temperatures; and comparing the first and second set of values to determine an annealing temperature or a range of annealing temperatures where the carrier lifetime and the resistivity of the material are optimized.

2. The method of claim 1, further comprising:

determining an optimum annealing duration for the material.

3. The method of claim 1, wherein the properties enhanced include carrier lifetime and resistivity.

4. A method of producing a semiconductor material with photoconductive properties, the method comprising annealing the base material at a temperature of 475° C. or less so as to enhance the carrier lifetime of the material and the resistivity of the material for use as a photoconductor, the temperature being determined according to the method of claim 1.

5. The method of claim 1, wherein the annealing occurs at a temperature in the range of 250° C. and 450° C.

6. The method of claim 1, wherein the base material is grown using molecular beam epitaxy.

7. The method according to claim 1, wherein the base material is formed in a growth chamber and annealing occurs outside the growth chamber.

8. The method according to claim 1, wherein the semiconductor is a Group III-V semiconductor with photoconductive properties.

9. The method according to claim 1, wherein the semiconductor comprises As.

10. The method according to claim 1, wherein the base material is GaAs.

11. The method according to claim 1, wherein the base material is InGaAs.

12. The method according to claim 1, wherein the annealing is performed for fifteen minutes or less.

13. A semiconductor material formed using the method of claim 1.

14. The method of claim 2, wherein the optimum annealing duration is determined by obtaining a third set of values indicative of arsenic concentration of the material for a plurality of annealing durations and for at least one annealing temperature; comparing the at least one third set of values with the first and second sets of values to determine an annealing duration and an annealing temperature which together optimize the carrier lifetime and the resistivity of the material.

15. The method according to claim 10, wherein the wherein the GaAs is grown in a molecular beam epitaxy reactor at a temperature in the range of approximately 200° C. to 300° C.

16. The method of claim 11, wherein the base material is annealed at a temperature in the range of 350° C. to 450° C.

17. The emitter of claim 16, wherein the emitter is configured to emit terahertz radiation formed using a method according to claim 1.

18. A photoconductive emitter comprising the semiconductor material of claim 13.

19. A photoconductive receiver comprising the semiconductor material of claim 13.

20. The receiver of claim 19, wherein the receiver is configured to receive terahertz radiation.

* * * * *